United States Patent [19]
Kawada

[11] Patent Number: 5,175,548
[45] Date of Patent: Dec. 29, 1992

[54] DIGITAL-ANALOG CONVERTER INCLUDING A REDUCED NUMBER OF RESISTORS ARRANGED IN A STRING

[75] Inventor: Shigeru Kawada, Tokyo, Japan
[73] Assignee: Nec Corporation, Japan
[21] Appl. No.: 776,177
[22] Filed: Oct. 15, 1991
[30] Foreign Application Priority Data
  Oct. 12, 1990 [JP] Japan .................... 2-274788
[51] Int. Cl.⁵ .......................................... H03M 1/78
[52] U.S. Cl. .................... 341/144; 341/154
[58] Field of Search ............... 341/145, 144, 146, 148, 341/153, 154

[56] References Cited
U.S. PATENT DOCUMENTS
4,647,903  3/1987  Ryu ....................... 341/154
5,008,676  4/1991  Kanoh ..................... 341/154

Primary Examiner—A. D. Pellinen
Assistant Examiner—B. K. Young
Attorney, Agent, or Firm—Ostrolenk, Faber, Gerb & Soffen

[57] ABSTRACT

A digital-analog converter according to the invention comprises a resistance circuit including a plurality of resistors connected in series, a switching circuit including a plurality of switching element disposed between the resistance circuit and an analog output terminal, a control-signal generating circuit for selectively turning on and off the switching elements, and a change-over circuit for switching the resistance circuit. The resistance circuit includes a first resistor having a resistance value of one half a unit resistance value and unit resistors of a unit resistance value and connected in series, the number of unit resistors provided being expressed by 2 to the $(n-1)$th power. The change-over circuit functions to connect resistors having a unit resistance value in parallel with selected unit resistors in the resistance circuit by means of changing switches which are selectively turned on and off by the control-signal generating circuit.

4 Claims, 4 Drawing Sheets

DIGITAL-ANALOG CONVERTER INCLUDING A REDUCED NUMBER OF RESISTORS ARRANGED IN A STRING

BACKGROUND OF THE INVENTION

1. Field of the Invention

This invention relates to a digital-analog converter which converts digital signals into analog signals. Especially, it relates to the digital-analog converter of the resistor string type.

2. Description of the Prior Art

Digital-analog converters convert digital signals to analog signals. In the prior art these converters are generally of the resistor string and R-2R types. The resistor string type has resistors connected in series and analog output voltages are at connecting points of the resistors, while the R-2R type has resistors, with unit resistor values of R and 2R, connected to each other in a ladder-like form.

Digital-analog converters of the resistor string type are widely used because they have a simple construction, provide comparatively high precision, guarantee monotonicity, and they do not produce any bit-errors.

FIG. 4 shows the conventional circuit components of a 4-bit digital-analog converter of the resistor string type.

This digital-analog converter is equipped with a resistor string 401 which consists of unit resistors R101 through R116 having a resistor value of R and connected with each other in series. Connected to the both ends of this resistor string 401 are the first reference voltage terminal 411 and the second reference voltage terminal 412, respectively.

Analog switches SW101 through SW116 are provided between each connecting point of the unit resistors R101 through R116 and an analog signal output terminal 413 which produces converted analog signals. These analog switches SW101 through SW116 are turned on and off by the signals into which a control-signal generating circuit 403 has decoded bits D3, D2, D1 and D0 given at the respective digital input signal terminals 431 through 434. However, control-signal terminals between the analog switches SW101 through SW116 and the control-signal generating circuit 403 are not shown in FIG. 4. In this example of prior art, the well-known 4-16 decoder circuit is used for the control-signal generating circuit 403.

The operation of the conventional digital-analog converter of the resistor string type will be described below with reference to FIG. 4.

In the drawing, the voltage given at the first reference voltage terminal 411 is VR1, the voltage given at the second reference voltage terminal 412 is VR2, the analog output voltage at the analog signal output terminal 413 is V0, the signal bit D3 given to the digital input signal terminal 431 is the most significant bit (MSB), bit D2 given at the terminal 432 is the second bit (2SB), bit D1 given at the terminal 433 is the third bit (3SB), and bit D0 given at the terminal 434 is the least significant bit (LSB).

The difference of the voltage between VR1 and VR2, i.e. (VR1−VR2) is divided, and analog output voltage shown as $V0 = VR2 + i/16 \times (VR1-VR2)$; i=1 to 15 is obtained at each connecting point of the unit resistors R101 through R116, wherein the voltages VR1 and VR2 are given to the first and second reference voltage terminals 411 and 412, respectively by the unit resistors R101 through R116 of the resistor string 401. The analog output voltage V0 corresponding to the digital signals D3 through D0 is provided to the analog signal output terminal 413 by turning on and off the switches SW101 through SW116 according to the combination of the digital signals D3 through D0.

Table 1-1 through 1-2 shows ON's and OFF's of the switches SW101 through SW116 according to the combination of bits D3 through D0 of each digital input signal and their corresponding analog output voltages. It is noted that an ON and OFF show the conductive and non-conductive conditions of a switch, respectively.

TABLE 1-1

| Digital input signal | | | | Conditions of a switch SW101-SW116 | | |
|---|---|---|---|---|---|---|
| D3 | D2 | D1 | D0 | | | |
| 0 | 0 | 0 | 0 | SW101-115 = OFF | SW116 = ON | |
| 0 | 0 | 0 | 1 | SW101-114 = OFF | SW115 = ON | SW116 = OFF |
| 0 | 0 | 1 | 0 | SW101-113 = OFF | SW114 = ON | SW115-116 = OFF |
| 0 | 0 | 1 | 1 | SW101-112 = OFF | SW113 = ON | SW114-116 = OFF |
| 0 | 1 | 0 | 0 | SW101-111 = OFF | SW112 = ON | SW113-116 = OFF |
| 0 | 1 | 0 | 1 | SW101-110 = OFF | SW111 = ON | SW112-116 = OFF |
| 0 | 1 | 1 | 0 | SW101-109 = OFF | SW110 = ON | SW111-116 = OFF |
| 0 | 1 | 1 | 1 | SW101-108 = OFF | SW109 = ON | SW110-116 = OFF |
| 1 | 0 | 0 | 0 | SW101-107 = OFF | SW108 = ON | SW109-116 = OFF |
| 1 | 0 | 0 | 1 | SW101-106 = OFF | SW107 = ON | SW108-116 = OFF |
| 1 | 0 | 1 | 0 | SW101-105 = OFF | SW106 = ON | SW107-116 = OFF |
| 1 | 0 | 1 | 1 | SW101-104 = OFF | SW105 = ON | SW106-116 = OFF |
| 1 | 1 | 0 | 0 | SW101-103 = OFF | SW104 = ON | SW105-116 = OFF |
| 1 | 1 | 0 | 1 | SW101-102 = OFF | SW103 = ON | SW104-116 = OFF |
| 1 | 1 | 1 | 0 | SW101 = OFF | SW102 = ON | SW103-116 = OFF |
| 1 | 1 | 1 | 1 | SW101 = ON | | SW102-116 = OFF |

TABLE 1-2

| Digital input signal | | | | Analog output voltages |
|---|---|---|---|---|
| D3 | D2 | D1 | D0 | |
| 0 | 0 | 0 | 0 | VR2 + 0/16 × (VR1-VR2) |
| 0 | 0 | 0 | 1 | VR2 + 1/16 × (VR1-VR2) |
| 0 | 0 | 1 | 0 | VR2 + 2/16 × (VR1-VR2) |
| 0 | 0 | 1 | 1 | VR2 + 3/16 × (VR1-VR2) |
| 0 | 1 | 0 | 0 | VR2 + 4/16 × (VR1-VR2) |
| 0 | 1 | 0 | 1 | VR2 + 5/16 × (VR1-VR2) |
| 0 | 1 | 1 | 0 | VR2 + 6/16 × (VR1-VR2) |
| 0 | 1 | 1 | 1 | VR2 + 7/16 × (VR1-VR2) |
| 1 | 0 | 0 | 0 | VR2 + 8/16 × (VR1-VR2) |
| 1 | 0 | 0 | 1 | VR2 + 9/16 × (VR1-VR2) |
| 1 | 0 | 1 | 0 | VR2 + 10/16 × (VR1-VR2) |
| 1 | 0 | 1 | 1 | VR2 + 11/16 × (VR1-VR2) |
| 1 | 1 | 0 | 0 | VR2 + 12/16 × (VR1-VR2) |

TABLE 1-2-continued

| Digital input signal | | | | |
|---|---|---|---|---|
| D3 | D2 | D1 | D0 | Analog output voltages |
| 1 | 1 | 0 | 1 | $VR2 - 13/16 \cdot (VR1-VR2)$ |
| 1 | 1 | 1 | 0 | $VR2 - 14/16 \cdot (VR1-VR2)$ |
| 1 | 1 | 1 | 1 | $VR2 - 15/16 \cdot (VR1-VR2)$ |

In such a digital-analog converter of the resistor string type, the conversion of digital signals of n bits requires unit resistors in the quantity of 2 to the n-th power. For instance, in case of 8 bits, many resistors are required, i.e. 2 to the 8th power, or 256 resistors. In addition, the same quantity of switches is also required, i.e. 2 to the n-th power. Accordingly, when a digital-analog converter is formed in an integrated circuit, for example, a disadvantage is that unit resistors and switches require a large space.

Furthermore, it is very difficult to provide unit resistors that have the same resistance value in a very large space on an integrated circuit due to the dispersion in the production and defects of IC substrate. This also provides poor conversion characteristics.

Another disadvantage is that testing of a digital-analog converter requires a very long process because the resistance value of each unit resistor does affect the output characteristics directly in the resistor string type. In case of 8 bits, it is necessary to measure the digital input signal 256 times from the zero scale to the full scale. The zero scale has 0's in all the bits from the MSB to the LSB, and the full scale has 1's in all the bits.

SUMMARY OF THE INVENTION

A primary object of the present invention is to provide a digital-analog converter of the resistor string type which considerably reduces the number of resistors and switching elements in a resistance circuit compared to the conventional digital-analog converters, thus decreasing the areas required for circuit components, and simplifying the integrity of circuits.

A further object of the invention is to provide a digital-analog converter that is hardly affected by the dispersion in the production of unit-resistors and switches, and that has stable conversion characteristic.

Another object of the present invention is to provide a digital-analog converter that shortens the time required for measuring output characteristics.

The foregoing objects are accomplished in a preferred embodiment according to the present invention by providing a digital-analog converter to convert digital signals of n bits into analog signals, which comprises; a resistance circuit consisting of a first resistor and unit resistors in the quantity of 2 to the (n−1)th power; said first resistor having the resistance value of one half that of the unit resistor connected to a first reference voltage terminal; and said unit resistors having a unit resistance value and connected in series between said first resistor and a second reference voltage terminal; and a switching circuit having a plurality of switching elements connected in parallel between a connecting point of each resistor in said resistance circuit and an output terminal for analog signals; a control signal generating circuit which selectively turns on and off a plurality of said switching elements: according to the digital input signal of n bits; and a switching circuit having switches and resistors; said switches being turned on and off selectively by said control-signal generating circuit; and said unit resistance value being connected in parallel to one of resistors of said resistance circuit by turning on and off said switches.

In the preferred embodiment, said switching circuit further comprises: a first and second switches connected to the both ends of said unit resistor which is connected, in turn, to the first resistor in said resistance circuit; a third and fourth switches connected to the both ends of said unit resistor which is connected, in turn, to the second reference voltage terminal; and a unit resistor connected to the first resistor in said resistance circuit via the first and second switches or the third and fourth switches; or a single resistor connected in parallel to the unit-resistor which is connected, in turn, to the second reference voltage terminal.

Furthermore, according to the preferred embodiment, said switching circuit has a first resistor which is connected via the first switch to said first resistor in said resistance circuit, and a second resistor which is connected via the second switch to the unit-resistor connected to the second reference voltage terminal.

Other objects and advantages according to the present invention will further be described below in detail.

DESCRIPTION OF THE PREFERRED EMBODIMENTS

Figure 1:
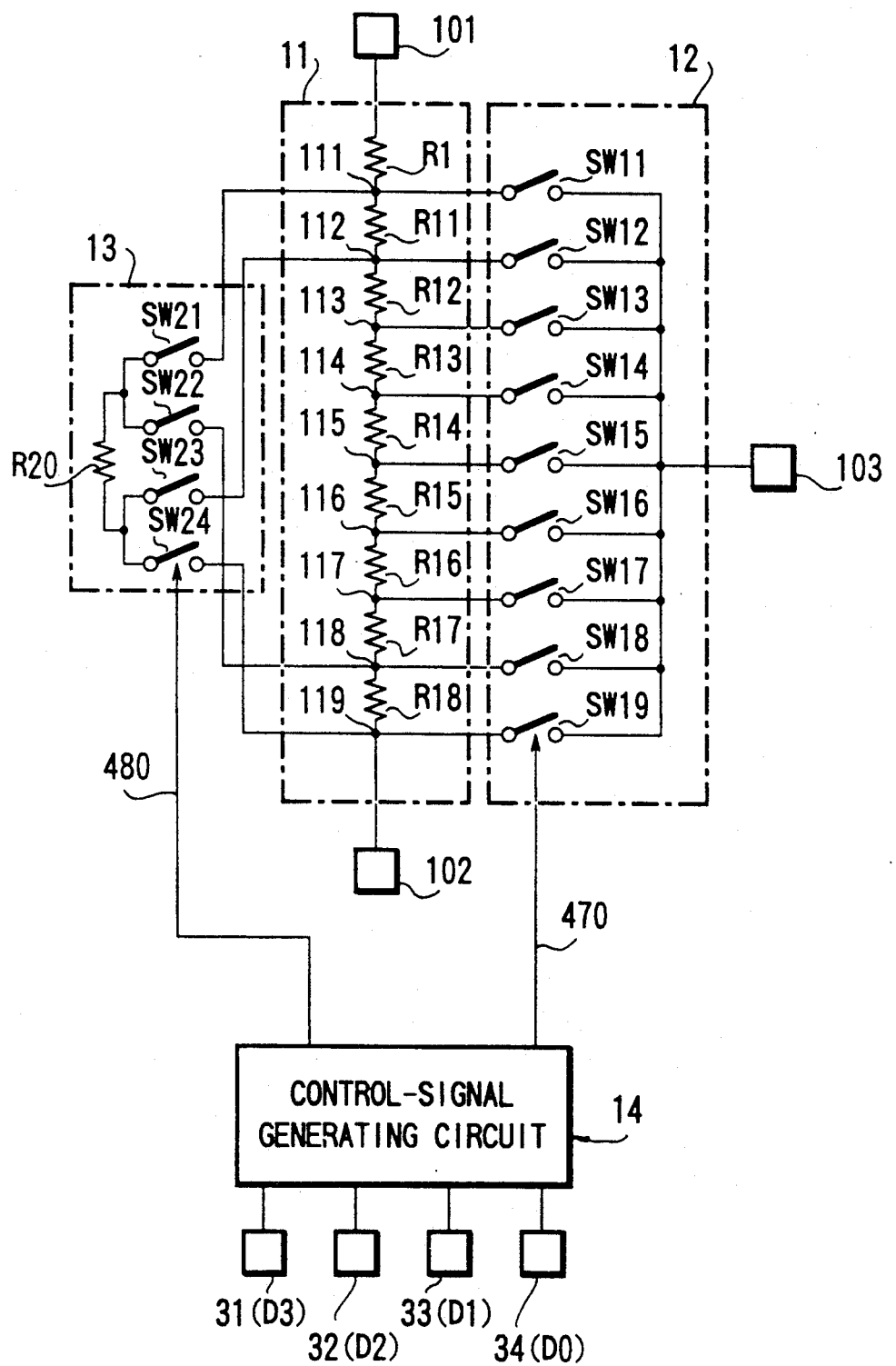
FIG. 1 is the circuit diagram of a 4-bit digital-analog converter according to the first preferred embodiment of the invention.

Referring to FIG. 1, the first preferred embodiment according to the invention will be described below. This preferred embodiment shows a 4-bit digital-analog converter to which the invention is applied.

This digital-analog converter comprises a serial resistance circuit 11 provided between the first reference voltage terminal 101 and the second reference voltage terminal 102, both of which supply the reference voltage, a switching circuit 12 provided between the analog signal output terminal 103 to send out converted analog signals from the serial resistance circuit 11, a switching or change-over circuit 13 for the serial resistance circuit 11, and a control-signal generating circuit 14 to selectively turn on and off a plurality of switches according to digital input signals of 4 bits. The serial resistance circuit 11 comprises a resistor R1 and resistors R11 through R18 in the quantity of 2 to the (4−1)th power, or 8; said resistor R1 have a resistance value of one half that of each of the unit Resistors R11 through R18 (the unit resistance value is assumed as R) is connected to the first reference voltage terminal 101; said unit resistors R11 through R18 having a unit resistance value and being connected in series to the resistor R1 and to the second reference voltage terminal 102.

The switching circuit 12 comprises analog switches SW11 through SW19 which are connected in series between connecting points 111 through 119 and the analog signal output terminal 103; said connecting points 111 through 119 being located between the resistor R1 and resistors R11 through R18 in the serial resistance circuit 11. Each one of these analog switches SW11 through SW19 produces the voltage divided by the resistors R11 through R18 of the serial resistance circuit 11, on the analog signal output terminal 103.

The switching circuit 13 comprises connecting switches SW21 through SW24 and a resistor R20 having the same resistance value as the unit resistance value (R). One end of the resistor R20 is connected to the connecting points 111 and 118 via connecting switches SW21 and SW22. The other end of the resistor R20 is connected to the connecting points 112 and 119 via connecting switches SW23 and SW24. Therefore, the resistor R20 is connected in parallel with the resistor R11 in the serial resistance circuit 11 via the connecting switches SW21 and SW23, and also in parallel with the resistor R18 in the serial resistance circuit 11 via the connecting switches SW22 and SW24.

The control-signal generating circuit 14 decodes the digital input signals and produces control signals to turn on and off the switches SW11 through SW19 in the switching circuit 12 and the connecting switches SW21 through SW24 in the switching circuit 13. An example of this control-signal generating circuit 14 is shown in detail in FIG. 2.

Combining an inverter circuits 411 through 414, an exclusive OR gate 421, AND gates 431 through 434 and 435 through 441, OR gates 451 and 452, and a NOR gate 461, the control-signal generating circuit 14 comprises digital input signal terminals 31 through 34 to input 4-bit digital signals, control signal lines 470 having control signal output terminals 471 through 479 to produce signals to control each of switches SW11 through SW19 in the switching circuit 12, and control signal lines 480 having control signal terminals 481 through 484 to produce signals to control the connecting switches SW21 through SW24.

Put into the digital input signal terminals 31 through 34 is a digital signal of 4 bits consisting of bit D3 or the most significant bit (MSB), bit D2 or the second bit (2SB), bit D1 or the third bit (3SB) and bit D0 or the least significant bit (LSB). The switching control signal terminals 481 and 483 are directly connected to the digital input signal terminal 34 to which D0, i.e. the LSB, is put in. The switching control signal terminals 482 and 484 are connected to the digital input signal terminal 34 via the inverter 414.

Control signal output terminal 471 through 479 of the control signal lines 470 and the switching control signal terminal 481 through 484 of the control signal lines 480 are connected to each of the analog switches SW11 through SW19 of the switching circuit 12, and the connecting switches SW21 through SW24 of the switching circuit 13, respectively. The analog switches SW11 through SW19 are designed to be turned on when the signal logic level of the control signal output terminals is 1, and to be turned off when it is 0. The connecting switches SW21 and SW23 are turned on when the signal logic level of the switching control signal terminals 481 and 483, i.e. D0 (LSB) of a digital signal is a 0, and to be turned off when it is a 1. The connecting switches SW22 and SW24 are turned off when the signal logic level of the switching control signal terminals 482 and 484, i.e. D0 (LSB) of a digital signal is a 0, and to be turned on when it is a 1.

The operation of the aforementioned digital-analog converter will be described below. Among the digital input signals D3 through D0, when D0, i.e. the LSB is a 0, the control signal terminals 481 and 483 are 0's, the connecting switches SW21 and SW23 are turned on, and the resistor R20 in the switching circuit 13 is connected in parallel to the resistor R11 of the serial resistance circuit 11. At this time, switches SW22 and SW24 are turned off because the levels of the switching signal terminals 482 and 484 are 1's.

Under the above condition, several resistors are connected between the first reference voltage terminal 101 and the second reference voltage terminal 102. These resistors are, in the order, the resistor R1 having a resistance value of $\frac{1}{2}R$, parallel connected resistors R11 and R20 having a total resistance value of $\frac{1}{2}R$ and the resistors R12 through R18 each having a unit resistance value of R. Because of this, the analog output voltage V0 at each of the connecting points 111 through 118, which is divided by each of the resistors R1 and R11 through R18, is equal to the second reference voltage VR2 plus the voltage difference (VR1−VR2), i.e. the difference between VR1, or the voltage VR1 of the first terminal and VR2, or the voltage VR2 of the second terminal, times 0/16, 2/16, 4/16, 6/16, 8/16, 10/16, 12/16, 14/16 and 15/16. That is to say, the voltage V0 at each of the connecting points is obtained by the following equation:

$$V0 = VR2 + i/16 \times (VR1 - VR2)$$

wherein;
(i = 0, 2, 4, 6, 8, 10, 12, 14, 15)

On the other hand, when the LSB is a 1, the switching control signal terminals 481 and 483 are 1's, and the switching control signal terminals 482 and 484 are 0's. Therefore, the switches SW22 and SW24 are ON, whereas SW21 and SW23 are OFF. This makes the resistor R20 connected in parallel to the resistor R18 in the serial resistance circuit 11.

Accordingly, the analog output voltage V0 at the connecting points 111 through 118 of the resistance R11 through R18 is equal to the second reference voltage VR2 plus the voltage difference (VR1−VR2) times 0/16, 1/16, 3/16, 5/16, 7/16, 9/16, 11/16, 13/16 and 15/16. That is to say, the voltage V0 at each of the connecting points is obtained by the following equation:

$$V0 = VR2 + i/16 \times (VR1 - VR2)$$

wherein;
(i = 0, 1, 3, 5, 7, 9, 11, 13, 15)

As previously noted, the digital-analog converter can provide 16 different analog output voltages, i.e. V0 = VR2 + i/16 × (VR1 − VR2) wherein i = 0 through 15, by using the connecting switches SW21 through SW24 of the switching circuit 13, according to the LSB (D0) of a digital signal. Therefore, analog output voltages corresponding to 4-bit digital signals from "0000" to "1111" can be obtained at the analog signal output terminal 103 by selectively turning on one of the analog switches SW11 through SW19 in the switching circuit 12. These analog switches SW11 through SW19 are turned on by the control signal output terminals 471 through 479 in the control-signal generating circuit 14 according to the values of digital signals D3 through D0 put into the digital input temrinals 31 through 34. Table 2-1 through 2-3 shows the condition of ON's and OFF's of the analog switches SW11 through SW19 and the connecting switches SW21 through SW24, corresponding to the combinations of the digital signals D3 through D0.

TABLE 2-1

| Digital input signal | | | | Conditions of the analog swatch SW11-SW19 | | |
|---|---|---|---|---|---|---|
| D3 | D2 | D1 | D0 | | | |
| 0 | 0 | 0 | 0 | SW11-18 = OFF | SW19 = ON | |
| 0 | 0 | 0 | 1 | SW11-17 = OFF | SW18 = ON | SW19 = OFF |
| 0 | 0 | 1 | 0 | SW11-17 = OFF | SW18 = ON | SW19 = OFF |
| 0 | 0 | 1 | 1 | SW11-16 = OFF | SW17 = ON | SW18-19 = OFF |
| 0 | 1 | 0 | 0 | SW11-16 = OFF | SW17 = ON | SW18-19 = OFF |
| 0 | 1 | 0 | 1 | SW11-15 = OFF | SW16 = ON | SW17-19 = OFF |
| 0 | 1 | 1 | 0 | SW11-15 = OFF | SW16 = ON | SW17-19 = OFF |
| 0 | 1 | 1 | 1 | SW11-14 = OFF | SW15 = ON | SW16-19 = OFF |
| 1 | 0 | 0 | 0 | SW11-14 = OFF | SW15 = ON | SW16-19 = OFF |
| 1 | 0 | 0 | 1 | SW11-13 = OFF | SW14 = ON | SW15-19 = OFF |
| 1 | 0 | 1 | 0 | SW11-13 = OFF | SW14 = ON | SW15-19 = OFF |
| 1 | 0 | 1 | 1 | SW11-12 = OFF | SW13 = ON | SW14-19 = OFF |
| 1 | 1 | 0 | 0 | SW11-12 = OFF | SW13 = ON | SW14-19 = OFF |
| 1 | 1 | 0 | 1 | SW11 = OFF | SW12 = ON | SW13-19 = OFF |
| 1 | 1 | 1 | 0 | SW11 = OFF | SW12 = ON | SW13-19 = OFF |
| 1 | 1 | 1 | 1 | | SW11 = ON | SW12-19 = OFF |

TABLE 2-2

| Digital input signal | | | | Conditions of the connecting switch | | | |
|---|---|---|---|---|---|---|---|
| D3 | D2 | D1 | D0 | SW21 | SW21 | SW23 | SW24 |
| 0 | 0 | 0 | 0 | ON | OFF | ON | OFF |
| 0 | 0 | 0 | 1 | OFF | ON | OFF | ON |
| 0 | 0 | 1 | 0 | ON | OFF | ON | OFF |
| 0 | 0 | 1 | 1 | OFF | ON | OFF | ON |
| 0 | 1 | 0 | 0 | ON | OFF | ON | OFF |
| 0 | 1 | 0 | 1 | OFF | ON | OFF | ON |
| 0 | 1 | 1 | 0 | ON | OFF | ON | OFF |
| 0 | 1 | 1 | 1 | OFF | ON | OFF | ON |
| 1 | 0 | 0 | 0 | ON | OFF | ON | OFF |
| 1 | 0 | 0 | 1 | OFF | ON | OFF | ON |
| 1 | 0 | 1 | 0 | ON | OFF | ON | OFF |
| 1 | 0 | 1 | 1 | OFF | ON | OFF | ON |
| 1 | 1 | 0 | 0 | ON | OFF | ON | OFF |
| 1 | 1 | 0 | 1 | OFF | ON | OFF | ON |
| 1 | 1 | 1 | 0 | ON | OFF | ON | OFF |
| 1 | 1 | 1 | 1 | OFF | ON | OFF | ON |

TABLE 2-3

| Digital input signal | | | | Analog output voltages |
|---|---|---|---|---|
| D3 | D2 | D1 | D0 | |
| 0 | 0 | 0 | 0 | VR2 + 0/16 × (VR1-VR2) |
| 0 | 0 | 0 | 1 | VR2 + 1/16 × (VR1-VR2) |
| 0 | 0 | 1 | 0 | VR2 + 2/16 × (VR1-VR2) |
| 0 | 0 | 1 | 1 | VR2 + 3/16 × (VR1-VR2) |
| 0 | 1 | 0 | 0 | VR2 + 4/16 × (VR1-VR2) |
| 0 | 1 | 0 | 1 | VR2 + 5/16 × (VR1-VR2) |
| 0 | 1 | 1 | 0 | VR2 + 6/16 × (VR1-VR2) |
| 0 | 1 | 1 | 1 | VR2 + 7/16 × (VR1-VR2) |
| 1 | 0 | 0 | 0 | VR2 + 8/16 × (VR1-VR2) |
| 1 | 0 | 0 | 1 | VR2 + 9/16 × (VR1-VR2) |
| 1 | 0 | 1 | 0 | VR2 + 10/16 × (VR1-VR2) |
| 1 | 0 | 1 | 1 | VR2 + 11/16 × (VR1-VR2) |
| 1 | 1 | 0 | 0 | VR2 + 12/16 × (VR1-VR2) |
| 1 | 1 | 0 | 1 | VR2 + 13/16 × (VR1-VR2) |
| 1 | 1 | 1 | 0 | VR2 + 14/16 × (VR1-VR2) |
| 1 | 1 | 1 | 1 | VR2 + 15/16 × (VR1-VR2) |

The conventional 4-bit digital-analog converter requires 16 (2 to the 4th power) resistors. However, the digital-analog converter according to the preferred embodiment uses only ten resistors to achieve the same functions. These ten resistors consist of nine unit resistors of R11 through R18 and R20, the number of which is 2 to the (4-1) the power+1=9, and one resistor R1 having ½ of the unit-resistance value. Moreover, the conventional converter requires switching elements in the quantity of 2 to the 4th power i.e., 16. In the present embodiment, however, the number of switches can be reduced to thirteen, i.e. nine switches SW11 through SW19 plus four switches SW21 through SW24. Regarding the testing for output characteristics, the conventional digital-analog converter needs measurements of the output characteristics for all the combinations of digital signals to obtain the dispersion of each resistance value. For instance, if one measurement requires 0.02 seconds, all the measurements takes 0.02×16 (2 to the 4th power), or 0.32 seconds. The digital-analog converter according to the present invention requires only nine measurements wherein the resistor R20 is connected in parallel either to the resistor R11 or R18 while tested. In other words, a measurement takes 0.02×9=0.18 seconds, which is one half of that of the conventional converter.

Figure 3:
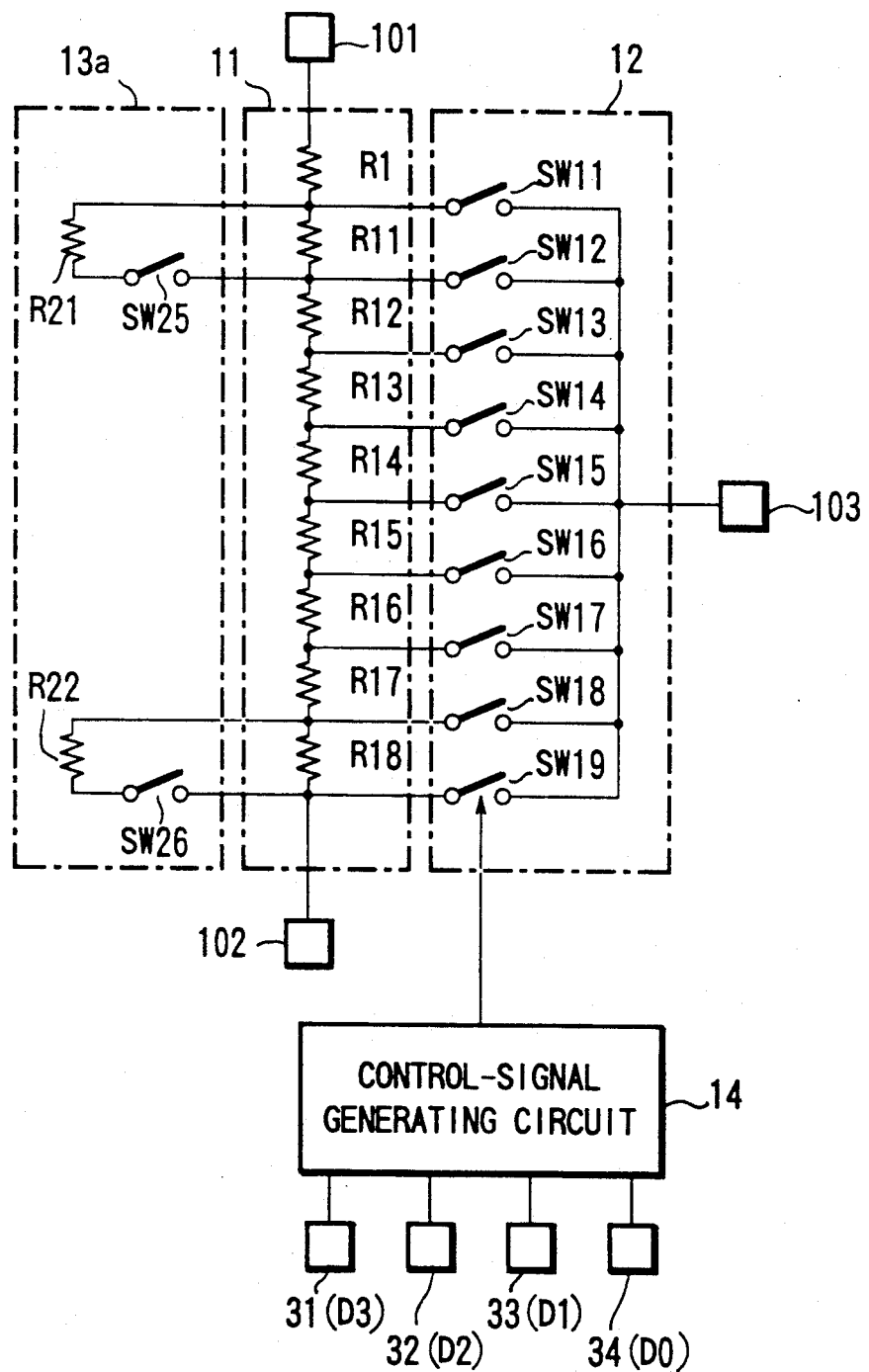
FIG. 3 is the circuit diagram of a 4-bit digital-analog converter according to the second embodiment of the invention.
Figure 4:
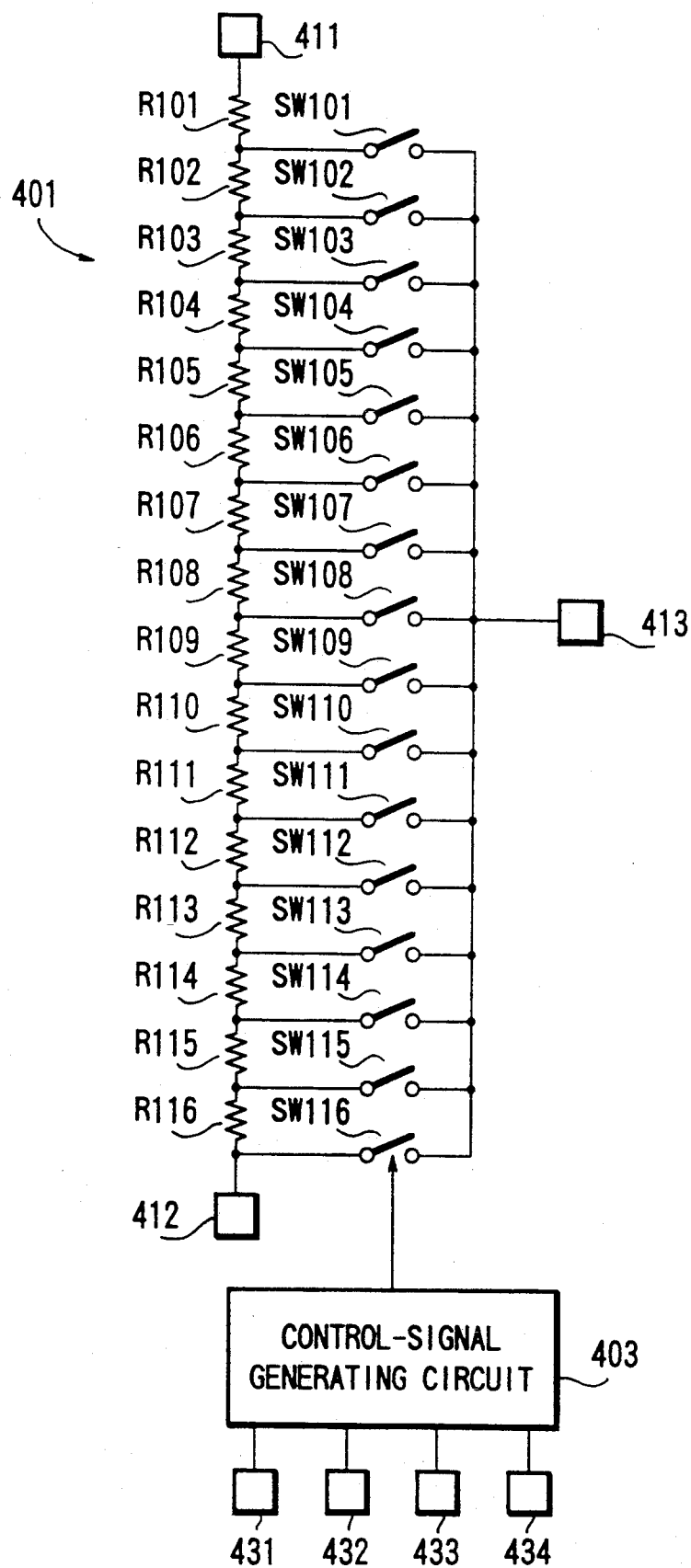
FIG. 4 is the circuit diagram of a conventional 4-bit digital-analog converter.

The second preferred embodiment according to the present invention is shown in FIG. 3. The digital-analog converter in FIG. 3 has the same numbers and symbols as those in the embodiment in FIG. 1. In this digital-analog converter, the switching circuit 13a comprises resistors R21 and R22, each having the same resistance value R as the unit-resistance value, and connecting switches SW25 and SW26. The resistor R21 is connected in parallel to the resistor R11 in the serial resistance circuit 11 via the connecting switch SW25, whereas the resistor R22 is connected in parallel to the resistor R18 in the serial resistance circuit 11 via the connecting switch SW26.

As in FIG. 1, the connecting switches SW25 and SW26 of FIG. 3 are controlled by the switching control signal terminals in the control-signal generating circuit 14 so as to be turned on and off. However, the number of connecting switches is two, and also the number of corresponding switching control signal terminals is two. For example, in FIG. 3, the switching control signal terminals are 481 and 482 only.

In the foregoing case, when the LSB (D0) of the digital signal is a 0, the connecting switch SW25 is ON, and SW26 is OFF. The resistor R11 is connected in parallel with the resister R21. On the other hand, when the LSB (D0) of the digital signal is a 1, the connecting switch SW25 is OFF, and SW26 is ON. The resistor R18 is connected in parallel with the resistor R22. Other operations are the same as those of FIG. 1.

The design of the switching circuit 13a such as the above reduces the number of connecting switches, so that the resistance value of switches when they are ON is less likely to influence circuit operation. As a result, the conversion characteristic is improved.

Figure 2:
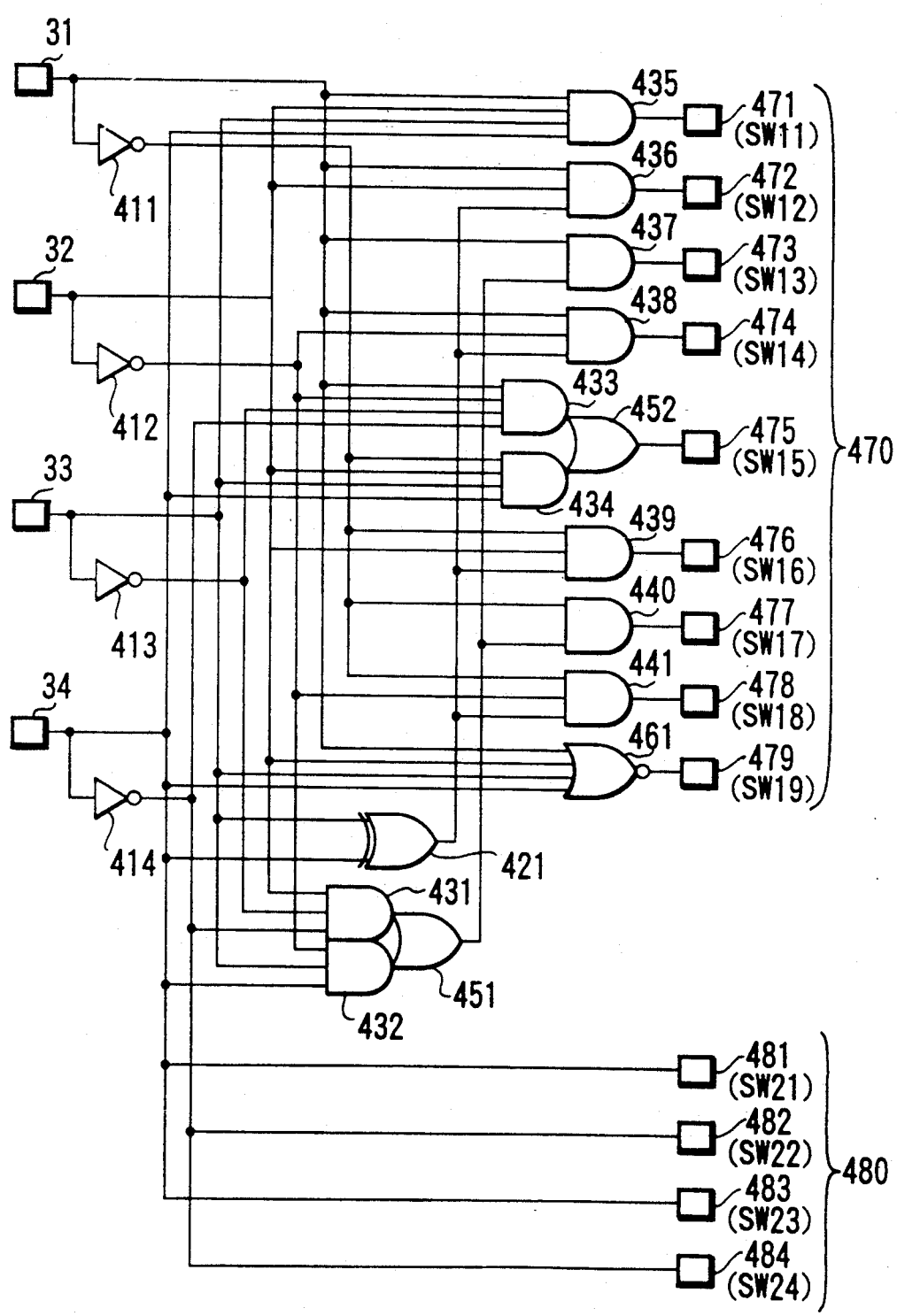
FIG. 2 is a circuit diagram showing an example of the control-signal generating circuit of the first preferred embodiment.

Needless to say, the invention may be embodied in different manner other than the above embodiments. For example, the connecting switch for the changing circuit may be controlled not only by the LSB of a digital signal but also be controlled by other bits. Although a digital-analog converter of a 4 bit type is shown in FIGS. 1 through 3, it is of course possible to apply the present invention to a digital-analog converter of a type other than of a 4 bit type. The present invention is not intended to be limited solely to a semiconductor integrated circuit but can be applied for example to a composite integrated circuit or a circuit construction in which discrete parts are provided on a printed circuit board. It should therefore be noted that any changes and modifications made to the above-described specific embodiments within the true spirit of the invention fall under the scope of protection of the invention defined by the appended claims.

What is claimed is:

1. A digital-analog converter for converting a digital signal of n bits into an analog signal, said converter comprising:
   a resistance circuit including a first resistor and unit resistors in the number of 2 to the (n−1)th power, said first resistor having the resistance value of one half that of the unit resistor connected thereto, said first resistor also being connected to a first reference voltage terminal, each of said unit resistors having a unit resistance value and connected together in series between said first resistor and a second reference voltage terminal;
   a switching circuit including a pluraliyt of switching elements each connected between a connecting point between predetermined resistors in said resistance circuit and an output terminal for said analog signal;
   a control-signal generating circuit which selectively turns on and off a plurality of said switching elements according to the digital input signal of n bits; and
   a change-over circuit including switches and a change-over resistor having the resistance value of one of said unit resistors, said switches being turned on and off selectively by a least significant bit of said digital signal;
   in response to said least significant bit of said digital signal, said change-over resistor being connected selectively either in parallel with a first of said unit resistors which is connected directly with said first resistor or in parallel with a second of said unit resistors which is connected directly with said second reference voltage terminal.

2. A digital-analog converter according to claim 1, wherein:

a first and a second of said switches respectively are connected to connecting points at opposite sides of said first unit resistor;
   a third and a fourth of said switches respectively connected to connecting points at opposite sides of said second unit resistor; and
   in response to said least significant bit of said digital signal, said change-ver resistor being connected either in parallel to said first one of said unit resistors through said first and second of said switches or in parallel to said second one of said unit resistors through said third and fourth of said switches.

3. A digital-analog converter for converting a digital signal of n bits into an analog signal, said converter comprising:
   a resistance circuit including a first resistor and unit resistors in the number of 2 to the (n−1)th power, said first resistor having the resistance value of one half that of the unit resistor connected thereto, said first resistor also being connected to a first reference voltage terminal, each of said unit resistors having a unit resistance value and connected together in series between said first resistor and a second reference voltage terminal;
   a switching circuit including a plurality of switching elements each connected between a connecting point between predetermined resistors in said resistance circuit and an output terminal for said analog signal;
   a control-signal generating circuit which selectively turns on and off a plurality of said switching elements according to the digital input signal of n bits; and
   a change-over circuit including switches and a first and a second change-over resistor each having the resistance value of one of said unit resistors, said switches being turned on and off selectively by a least significant bit of said digital signal;
   in response to said least significant bit of said digital signal, said first change-over resistor being connected selectively to either float or be in parallel with a first of said unit resistors which is connected direclty with said first resistor;
   said second change-over resistor floating whiel said first change-over resistor is connected in parallel with said first unit resistor, and whcn said first change-over resistor is floating said second change-over resistor being in parallel with a second of said unit resistors which is connected directly with said second reference voltage terminal.

4. A digital-analog converter according to claim 3, wherein:
   a first of said switches when closed connects said first change-over resistor in parallel circuit with said first unit resistor, and
   a second of said switches when closed connects said second change-over resistor in parallel circuit with said second unit resistor.

* * * * *